US011427210B2

(12) United States Patent
Rosman et al.

(10) Patent No.: US 11,427,210 B2
(45) Date of Patent: Aug. 30, 2022

(54) SYSTEMS AND METHODS FOR PREDICTING THE TRAJECTORY OF AN OBJECT WITH THE AID OF A LOCATION-SPECIFIC LATENT MAP

(71) Applicants: Toyota Research Institute, Inc., Los Altos, CA (US); Massachusetts Institute of Technology, Cambridge, MA (US)

(72) Inventors: Guy Rosman, Newton, MA (US); Igor Gilitschenski, Cambridge, MA (US); Arjun Gupta, Cambridge, MA (US); Sertac Karaman, Cambridge, MA (US); Daniela Rus, Weston, MA (US)

(73) Assignees: Toyota Research Institute, Inc., Los Altos, CA (US); Massachusetts Institute of Technology, Cambridge, MA (US)

( * ) Notice: Subject to any disclaimer, the term of this patent is extended or adjusted under 35 U.S.C. 154(b) by 332 days.

(21) Appl. No.: 16/835,408

(22) Filed: Mar. 31, 2020

(65) Prior Publication Data
US 2021/0081715 A1 Mar. 18, 2021

Related U.S. Application Data

(60) Provisional application No. 62/900,068, filed on Sep. 13, 2019.

(51) Int. Cl.
*G06K 9/00* (2022.01)
*B60W 50/02* (2012.01)
(Continued)

(52) U.S. Cl.
CPC ..... *B60W 50/0205* (2013.01); *B60R 16/0231* (2013.01); *B60W 50/06* (2013.01);
(Continued)

(58) Field of Classification Search
CPC ............ B60W 50/0205; B60W 50/06; B60W 60/001; B60W 60/0027; B60R 16/0231;
(Continued)

(56) References Cited

U.S. PATENT DOCUMENTS

| 2018/0053102 A1 | 2/2018 | Martinson et al. |
| 2019/0286990 A1 | 9/2019 | Kenney et al. |
| 2020/0239029 A1* | 7/2020 | Kim ................. B60W 60/0015 |

OTHER PUBLICATIONS

Lee et al., "DESIRE: Distant Future Prediction in Dynamic Scenes with Interacting Agents," in Proceedings of the Conference on Computer Vision and Pattern Recognition (CVPR), 2017, found at http://openaccess.thecvf.com/content_cvpr_2017/papers/Lee_DESIRE_Distant_Future_CVPR_2017_paper.pdf.

(Continued)

*Primary Examiner* — Charlotte M Baker
(74) *Attorney, Agent, or Firm* — Christopher G. Darrow; Darrow Mustafa PC

(57) ABSTRACT

Systems and methods for predicting the trajectory of an object are disclosed herein. One embodiment receives sensor data that includes a location of the object in an environment of the object; accesses a location-specific latent map, the location-specific latent map having been learned together with a neural-network-based trajectory predictor during a training phase, wherein the neural-network-based trajectory predictor is deployed in a robot; inputs, to the neural-network-based trajectory predictor, the location of the object and the location-specific latent map, the location-specific latent map providing, to the neural-network-based trajectory predictor, a set of location-specific biases regarding the environment of the object; and outputs, from the neural-network-based trajectory predictor, a predicted trajectory of the object.

20 Claims, 4 Drawing Sheets

(51) Int. Cl.
    G01R 31/317      (2006.01)
    G06N 3/08        (2006.01)
    B60W 50/06       (2006.01)
    G07C 5/08        (2006.01)
    B60W 60/00       (2020.01)
    B60R 16/023      (2006.01)
    G06K 9/62        (2022.01)
    G06N 3/04        (2006.01)
    G06V 20/20       (2022.01)
    G06V 20/56       (2022.01)
    G05D 1/00        (2006.01)

(52) U.S. Cl.
    CPC ...... *B60W 60/001* (2020.02); *B60W 60/0027* (2020.02); *G01R 31/3172* (2013.01); *G01R 31/31707* (2013.01); *G06K 9/6257* (2013.01); *G06N 3/0445* (2013.01); *G06N 3/0454* (2013.01); *G06N 3/082* (2013.01); *G06N 3/088* (2013.01); *G06V 20/20* (2022.01); *G06V 20/588* (2022.01); *G07C 5/0808* (2013.01); *G05D 1/0088* (2013.01); *G05D 2201/0213* (2013.01)

(58) Field of Classification Search
    CPC .......... G01R 31/31707; G01R 31/3172; G06K 9/6257; G06K 9/6271; G06N 3/0445; G06N 3/0454; G06N 3/082; G06N 3/088; G06N 3/0472; G06N 3/08; G06V 20/20; G06V 20/588; G06V 10/82; G06V 20/56; G07C 5/0808; G05D 1/0088; G05D 2201/0213; G08G 1/0112; G08G 1/0129; G08G 1/166
    USPC ........................................................ 382/103
    See application file for complete search history.

(56) References Cited

OTHER PUBLICATIONS

Wulfmeier et al., "Large-Scale Cost Function Learning for Path Planning Using Deep Inverse reinforcement Learning," The International Journal of Robotics Research, 2017, pp. 1073-1087, abstract linked at https://journals.sagepub.com/doi/10.1177/0278364917722396.

Chou et al., "Predicting Motion of Vulnerable Road Users Using High-Definition Maps and Efficient ConvNets," Jun. 20, 2019, found at https://arxiv.org/pdf/1906.08469.pdf.

Alahi et al., "Social LSTM: Human Trajectory Prediction in Crowded Spaces," 2016, found at http://openaccess.thecvf.com/content_cvpr_2016/papers/Alahi_Social_LSTM_Human_CVPR_2016_paper.pdf.

Kim et al., "Probabilistic Vehicle Trajectory Prediction over Occupancy Grid Map via Recurrent Neural Network," Sep. 2, 2017, found at https://arxiv.org/pdf/1704.07049.pdf.

Liu et al., "Predicting the Next Location: A Recurrent Model with Spatial and Temporal Contexts," Proceedings of the Thirtieth AAAI Conference on Artificial Intelligence (AAAI-16), 2016, found at https://www.aaai.org/ocs/index.php/AAAI/AAAI16/paper/viewFile/11900/11583.

Amini et al., Variational End-to-End Navigation and Localization, found at: netarXiv: 1811.10119v2[cs.LG] Jun. 11, 2019.

Huang et al., "Diversity-Aware Vehicle Motion Prediction via Latent Semantic Sampling", found at: annoarXiv: 1911.12736v1 [cs.RO] Nov. 28, 2019.

Gupta et al., "Social GAN: Socially Acceptable Trajectories with Generative Adversarial Networks", found at: arXiv:1803.10892v1 [cs.CV] Mar. 29, 2018.

Alahi et al., "Social LSTM: Human Trajectory Prediction in Crowded Spaces", IEEE Conference on Computer Vision and Pattern Recognition (CVPR), 2016, pp. 961-971.

Masoud et al., "A novel method for tracking and counting pedestrians in real-time using a single camera," Transactions on Vehicular Technology, vol. 50, No. 5, 2001.

Helbing et al., "Social force model for pedestrian dynamics," Physical Review E, vol. 51, No. 5, 1995.

Kosaraju et al., "Social-BiGAT: Multimodal Trajectory Forecasting using Bicycle-GAN and Graph Attention Networks," found at: arXiv:1907.03395v2 [cs CV] Jul. 17, 2019.

Sadeghian et al., "SoPhie: An Attentive GAN for Predicting Paths Compliant to Social and Physical Constraints," in Proceedings of the Conference on Computer Vision and Pattern Recognition (CVPR), 2019.

Ziebart et al., "Planning-based Prediction for Pedestrians," in Proceedings of the International Conference on Intelligent Robots and Systems (IROS), 2009.

Wiest et al., "Probabilistic trajectory prediction with Gaussian mixture models," in Proceedings of the Intelligent Vehicles Symposium (IV), 2012.

Asahara et al., "Pedestrian-movement Prediction Based on Mixed Markov-chain Model," in Proceedings of the International Conference on Advances in Geographic Information Systems (SIGSPATIAL), 2011.

Coscia et al., "Long-term path prediction in urban scenarios using circular distributions," Image and Vision Computing, 2018.

Habibi et al., "Context-Aware Pedestrian Motion Prediction in Urban Intersections," arXiv preprint:1806.09453, 2018.

Petrich et al., "Map-based long term motion prediction for vehicles in traffic environments," in Proceedings of the International Conference on Intelligent Transportation Systems (ITSC), 2013.

Ballan et al., "Knowledge Transfer for Scene-Specific Motion Prediction," in Proceedings of the European Conference on Computer Vision (ECCV), 2016.

Vemula et al., "Modeling cooperative navigation in dense human crowds," in Proceedings of the International Conference on Robotics and Automation (ICRA), 2017.

Deo et al., "Learning and predicting on-road pedestrian behavior around vehicles," in Proceedings of the International Conference on Intelligent Transportation Systems (ITSC), 2017.

Luo et al., "Fast and Furious: Real Time End-to-End 3D Detection, Tracking and Motion Forecasting With a Single Convolutional Net," in Proceedings of the Conference on Computer Vision and Pattern Recognition (CVPR), 2018.

Radwan et al., "Multimodal Interaction aware Motion Prediction for Autonomous Street Crossing," found at: arXiv:1808 06887v1 [cs RO] Aug. 21, 2018.

Pfeiffer et al., "A Data-driven Model for Interaction-aware Pedestrian Motion Prediction in Object Cluttered Environments," found at: pedesarXiv:1709.08528v2 [cs RO] Feb. 26, 2018.

Kooiji et al., "Context-Based Path Prediction for Targets with Switching Dynamics," International Journal of Computer Vision, 2018.

Sadeghian et al., "CAR-Net: Clairvoyant Attentive Recurrent Network," in Proceedings of the European Conference an Computer Vision (ECCV), 2018.

Xue et al., "SS-LSTM: A Hierarchical LSTM Model for Pedestrian Trajectory Prediction," in Proceedings of the Winter Conference on Applications of Computer Vision (WACV), 2018.

Yi et al., "Pedestrian Behavior Understanding and Prediction with Deep Neural Networks," in Proceedings of the European Conference on Computer Vision (ECCV), 2016.

Ramos et al., "Hilbert maps: Scalable continuous occupancy mapping with stochastic gradient descent," The International Journal of Robotics Research, vol. 35, No. 14, 2016.

Rehder et al., "Pedestrian Prediction by Planning Using Deep Neural Networks," found at: arXiv:1706.05904v2 [cs.CV] Jun. 20, 2017.

Gupta et al., "Cognitive Mapping and Planning for Visual Navigation," in Proceedings of the Conference on Computer Vision and Pattern Recognition (CVPR), 2017.

Gottopati et al., "Deep Active Localization," Robotics and Automation Letters, vol. 4, No. 4, 2019.

Goodfellow et al., "Generative Adversarial Nets," in Advances in Neural Information Processing Systems (NeurIPS), 2014.

(56) References Cited

OTHER PUBLICATIONS

Hochreiter et al., "Long Short-Term Memory," Neural Computation, vol. 9, No. 8, 1997.
Pellegrini et al., "You'll never walk alone: Modeling social behavior for multi-target tracking," in Proceedings of the International Conference on Computer Vision (ICCV), 2009.
Lerner et al., "Crowds by Example," Computer Graphics Forum, 2007.

* cited by examiner

SYSTEMS AND METHODS FOR PREDICTING THE TRAJECTORY OF AN OBJECT WITH THE AID OF A LOCATION-SPECIFIC LATENT MAP

CROSS-REFERENCE TO RELATED APPLICATION

This application claims the benefit of U.S. Provisional Patent Application No. 62/900,068, "Deep Context Map: Agent Trajectory Prediction Using Location-Specific Latent Maps," filed Sep. 13, 2019, which is incorporated by reference herein in its entirety.

TECHNICAL FIELD

The subject matter described herein generally relates to robots and, more particularly, to systems and methods for predicting the trajectory of an object with the aid of a location-specific latent map.

BACKGROUND

In a variety of robotics applications such as autonomous vehicles, factory robots, warehouse robots, and humanoid robots in homes or other settings, predicting the future trajectories of diverse objects is an important challenge, particularly in cluttered environments. In such environments, robotic machine-vision systems can face the challenges of social interactions among objects (e.g., pedestrians, in a vehicular application), rapid or sudden changes in behavior of the objects, and accounting for the peculiarities of the surrounding environment and the robot's interaction with it.

SUMMARY

An example of a system for predicting the trajectory of an object is presented herein. The system comprises one or more sensors, one or more processors, and a memory communicably coupled to the one or more processors. The memory stores a prediction module including instructions that when executed by the one or more processors cause the one or more processors to receive sensor data from the one or more sensors that includes a location of the object in an environment of the object. The prediction module also includes instructions that when executed by the one or more processors cause the one or more processors to access a location-specific latent map, the location-specific latent map having been learned together with a neural-network-based trajectory predictor during a training phase, wherein the neural-network-based trajectory predictor is deployed in a robot. The prediction module also includes instructions that when executed by the one or more processors cause the one or more processors to input, to the neural-network-based trajectory predictor, the location of the object and the location-specific latent map, the location-specific latent map providing, to the neural-network-based trajectory predictor, a set of location-specific biases regarding the environment of the object. The memory also stores an output module including instructions that when executed by the one or more processors cause the one or more processors to output, from the neural-network-based trajectory predictor, a predicted trajectory of the object.

Another embodiment is a non-transitory computer-readable medium for predicting the trajectory of an object and storing instructions that when executed by one or more processors cause the one or more processors to receive sensor data that includes a location of the object in an environment of the object. The instructions also cause the one or more processors to access a location-specific latent map, the location-specific latent map having been learned together with a neural-network-based trajectory predictor during a training phase, wherein the neural-network-based trajectory predictor is deployed in a robot. The instructions also cause the one or more processors to input, to the neural-network-based trajectory predictor, the location of the object and the location-specific latent map, the location-specific latent map providing, to the neural-network-based trajectory predictor, a set of location-specific biases regarding the environment of the object. The instructions also cause the one or more processors to output, from the neural-network-based trajectory predictor, a predicted trajectory of the object.

In another embodiment, a method of predicting the trajectory of an object is disclosed. The method comprises receiving sensor data that includes a location of the object in an environment of the object. The method also includes accessing a location-specific latent map, the location-specific latent map having been learned together with a neural-network-based trajectory predictor during a training phase, wherein the neural-network-based trajectory predictor is deployed in a robot. The method also includes inputting, to the neural-network-based trajectory predictor, the location of the object and the location-specific latent map, the location-specific latent map providing, to the neural-network-based trajectory predictor, a set of location-specific biases regarding the environment of the object. The method also includes outputting, from the neural-network-based trajectory predictor, a predicted trajectory of the object.

BRIEF DESCRIPTION OF THE DRAWINGS

So that the manner in which the above-recited features of the present disclosure can be understood in detail, a more particular description of the disclosure, briefly summarized above, may be had by reference to the implementations, some of which are illustrated in the appended drawings. It is to be noted, however, that the appended drawings illustrate only possible implementations of this disclosure and are therefore not to be considered limiting of its scope. The disclosure may admit to other implementations.

To facilitate understanding, identical reference numerals have been used, wherever possible, to designate identical elements that are common to the figures. Additionally, elements of one or more embodiments may be advantageously adapted for utilization in other embodiments described herein.

DETAILED DESCRIPTION

Figure 1:
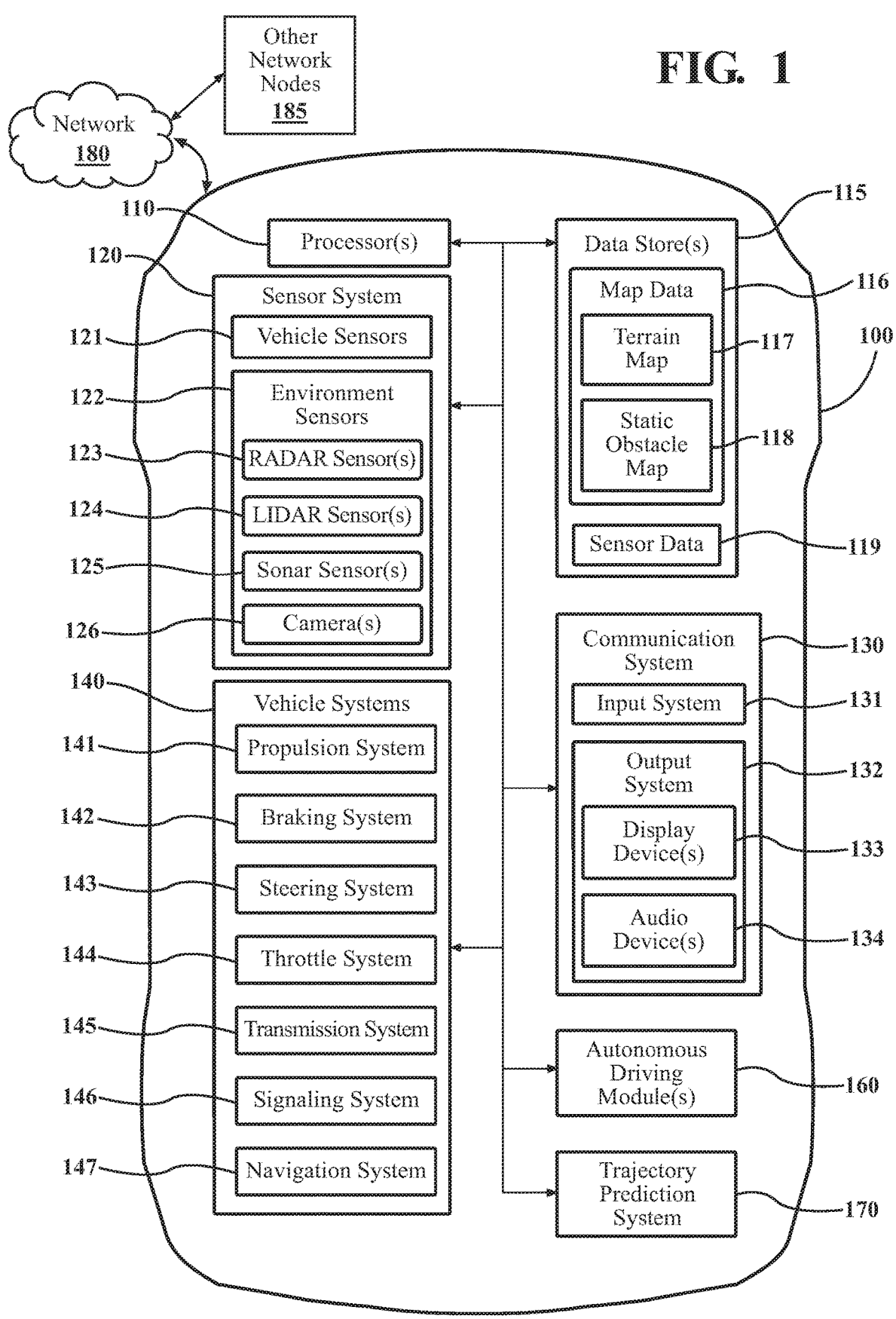
FIG. 1 illustrates one embodiment of a vehicle within which systems and methods disclosed herein may be implemented.

Conventional methods of predicting object trajectories fail to account for information that is not available through visual cues and to make effective use of the structure that is available through maps. For example, raw trajectory data contains a lot of information about local norms and the environment. Trajectories implicitly encode phenomena such as common paths, potential obstacles, and traffic flow and can be a rich source of non-visual information. This creates an opportunity to incorporate different types of subtle information into a contextual representation of the environment for the trajectory-prediction task.

Various embodiments described herein capture the ability of humans to account for the environment and location-specific habits and norms. This information is modeled by a set of location-specific latent maps (also sometimes referred to herein as "deep context maps," "context maps," or simply "maps") that are learned during predictor training. In some embodiments, location-specific latent maps are learned together with a neural-network-based trajectory predictor through weak supervision from past object trajectories during a training phase. Instead of presuming a predetermined structure, the embodiments described herein train the location-specific latent maps to explain not only visual features of an image but also non-visual features. The trained location-specific latent maps are implemented as a set of location specific biases that are injected into the neural-network-based trajectory predictor. Additional auxiliary loss terms based on image reconstruction, partial semantic annotations, and gradient sparsity provide support to guide the map-learning process.

Once the neural-network-based trajectory predictor and the location-specific latent maps have been learned/trained, the system receives sensor data from one or more sensors that includes a location of an object in the environment of the object and accesses a location-specific latent map. The location of the object and the location-specific latent map are input to the trained neural-network-based trajectory predictor, which outputs a predicted trajectory of the object. It is important to note that, with proper training, the system can predict object trajectories in locations for which no location-specific latent map was learned during the training phase. That is, a location-specific latent map can support improved object trajectory prediction even in a location other than that corresponding to the location-specific latent map itself.

In various embodiments, the neural-network-based trajectory predictor is deployed in a robot. In some embodiments, the robot is an ego vehicle (e.g., an automobile), and the object is a road agent (e.g., another vehicle, a motorcycle, a bicycle, a scooter, a pedestrian, etc.) external to the ego vehicle. In some of those embodiments, the ego vehicle is an autonomous vehicle. In other embodiments, the ego vehicle is a semi-autonomous or parallel-autonomy vehicle that is controlled (driven), at least in part, by a human driver, and the object is one and the same thing with the ego vehicle (i.e., the system predicts the trajectory of the ego vehicle itself in connection with, e.g., an advanced cruise control system or advanced driver-assistance system). In various vehicle-based embodiments, the system can, in addition to predicting the trajectory of an object, also infer information regarding roadway geometries (e.g., stop lines, lane boundaries, etc.).

A vehicle is merely one example of a robot in which the techniques and principles of the invention may be practiced. Though this description focuses primarily on vehicle-based embodiments, there are a wide variety of non-vehicle-based embodiments in which the inventive techniques and principles discussed herein may be applied, as discussed in the next paragraph.

In another category of embodiments, the robot, rather than being a vehicle, is a different kind of robot that is deployed in, for example, a factory, warehouse, shopping mall, residence, or other setting. In some of those embodiments, the robot is deployed inside a building. In other embodiments, the robot is deployed in an outdoor setting. Also, in some embodiments, the robot is a humanoid robot. In general, the robot may be fixed in location, or it may be mobile. The robot may be fully autonomous, or it may be controlled, at least in part, by a human operator.

Referring to FIG. 1, an example of a vehicle 100, in which systems and methods disclosed herein can be implemented, is illustrated. As discussed above, a vehicle is merely one example of a robot in which embodiments of the invention can be implemented. Sometimes herein, a vehicle 100 is referred to as an "ego vehicle 100"—a vehicle from whose point of view the future trajectory of the ego vehicle 100 itself or of an external road agent is predicted.

The vehicle 100 can include a trajectory prediction system 170 or components and/or modules thereof. As used herein, a "vehicle" is any form of motorized transport. In one or more implementations, the vehicle 100 can be an automobile. In some implementations, the vehicle 100 may be any other form of motorized transport. In some embodiments, vehicle 100 is capable of operating in a semi-autonomous or fully autonomous mode. In some embodiments, vehicle 100 includes an adaptive cruise control (ACC) system, an advanced driver-assistance system (ADAS), or other shared- or parallel-autonomy control system (not shown in FIG. 1).

The vehicle 100 can include the trajectory prediction system 170 or capabilities to support or interact with the trajectory prediction system 170 and thus benefits from the functionality discussed herein. While arrangements will be described herein with respect to automobiles, it will be understood that implementations are not limited to automobiles. Instead, implementations of the principles discussed herein can be applied to any kind of vehicle, as discussed above. Instances of vehicle 100, as used herein, are equally applicable to any device capable of incorporating the systems or methods described herein. Again, as mentioned above, in some embodiments, the robot in which the trajectory prediction system 170 is embodied is not a vehicle but is instead a different kind of robot.

The vehicle 100 also includes various elements. It will be understood that, in various implementations, it may not be necessary for the vehicle 100 to have all of the elements shown in FIG. 1. The vehicle 100 can have any combination of the various elements shown in FIG. 1. Further, the vehicle 100 can have additional elements to those shown in FIG. 1. In some arrangements, the vehicle 100 may be implemented without one or more of the elements shown in FIG. 1, including trajectory prediction system 170. While the various elements are shown as being located within the vehicle 100 in FIG. 1, it will be understood that one or more of these elements can be located external to the vehicle 100. Further, the elements shown may be physically separated by large distances. As shown in FIG. 1, vehicle 100 may communicate with one or more other network nodes 185 (cloud servers, infrastructure systems such as a roadside unit, etc.) via network 180. For example, in some embodiments, traffic statistics and/or trajectory data obtained from one or more sources such as cloud servers can be used during a training phase of trajectory prediction system 170. Further, real-time sensor data from an infrastructure system such as a roadside unit (RSU) can be used at inference time (i.e., during an on-line operational phase) to assist trajectory prediction system 170, in some embodiments.

Some of the possible elements of the vehicle 100 are shown in FIG. 1 and will be described in connection with subsequent figures. However, a description of many of the elements in FIG. 1 will be provided after the discussion of FIGS. 2-4 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those skilled in the art, however, will understand that the embodiments described herein may be practiced using various combinations of these elements.

Sensor system 120 can include one or more vehicle sensors 121. Vehicle sensors 121 can include one or more positioning systems such as a dead-reckoning system and/or a global navigation satellite system (GNSS) such as a global positioning system (GPS). Sensor system 120 can also include one or more environment sensors 122. Environment sensors 122 can include, for example, radar sensor(s) 123, Light Detection and Ranging (LIDAR) sensor(s) 124, sonar sensor(s) 125, and camera(s) 126.

Figure 2:
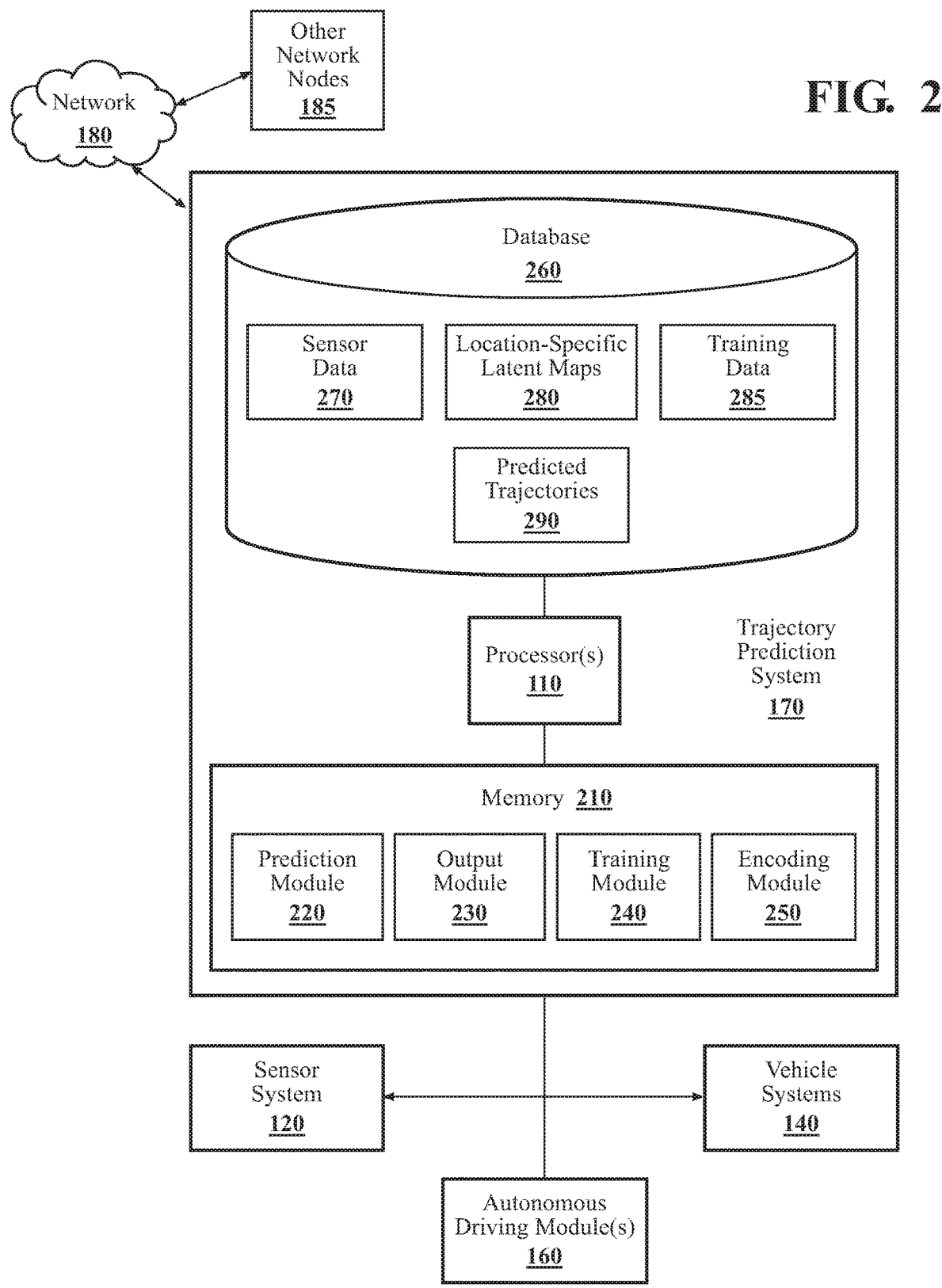
FIG. 2 illustrates one embodiment of a trajectory prediction system.

Referring to FIG. 2, one embodiment of the trajectory prediction system 170 of FIG. 1 is further illustrated. In this particular embodiment, the robot in which trajectory prediction system 170 is deployed is a vehicle 100. As discussed above, in other embodiments, trajectory prediction system 170 may be deployed in a different kind of robot other than a vehicle. In this embodiment, trajectory prediction system 170 is shown as including one or more processors 110 from the vehicle 100 of FIG. 1. In general, the one or more processors 110 may be a part of trajectory prediction system 170, trajectory prediction system 170 may include one or more separate processors from the one or more processors 110 of the vehicle 100, or trajectory prediction system 170 may access the one or more processors 110 through a data bus or another communication path, depending on the embodiment.

In one embodiment, memory 210 stores a prediction module 220, an output module 230, a training module 240, and an encoding module 250. The memory 210 is a random-access memory (RAM), read-only memory (ROM), a hard-disk drive, a flash memory, or other suitable memory for storing the modules 220, 230, 240, and 250. The modules 220, 230, 240, and 250 are, for example, computer-readable instructions that when executed by the one or more processors 110, cause the one or more processors 110 to perform the various functions disclosed herein.

As shown in FIG. 2, trajectory prediction system 170 can communicate with one or more other network nodes 185 (e.g., cloud servers, infrastructure systems such as roadside units, etc.) via network 180. As discussed above, in some embodiments, traffic statistics and/or trajectory data obtained from one or more sources such as cloud servers can be used during a training phase of trajectory prediction system 170. Also, real-time sensor data from an infrastructure system such as a RSU can be used at inference time (i.e., during an on-line operational phase) to assist trajectory prediction system 170, in some embodiments. As shown in FIG. 2, trajectory prediction system 170 can also communicate and interact with sensor system 120, vehicle systems 140, and autonomous driving module(s) 160.

In some embodiments, trajectory prediction system 170 stores sensor data 270 output by sensor system 120 in a database 260. In addition to the kinds of sensor data discussed above (image, radar, LIDAR, etc.), sensor data 270 can also include information derived from raw sensor data, such as object trajectories, poses, or position/location data (e.g., spatial coordinates). In some embodiments, trajectory prediction system 170 stores learned location-specific latent maps 280 in database 260. In other embodiments, the location-specific latent maps 280 are encoded using, for example, a convolutional neural network (CNN), and the encoded maps are stored in database 260. In some embodiments, trajectory prediction system 170 stores training data 285 in database 260. Training data 285 can include object position or trajectory data used to train a neural-network-based trajectory predictor and data used to learn the location-specific latent maps 280. In some embodiments, the location-specific latent maps 280 are learned using aerial (top-down) input images of the relevant locations. In other embodiments, other kinds of images (e.g., street-level images from vehicle and/or infrastructure cameras) can be used in learning the location-specific latent maps 280. In still other embodiments, other types of sensor data such as LIDAR data can be included in training data 285. Trajectory prediction system 170 can store, in database 260, predicted trajectories 290 output by a neural-network-based trajectory predictor. How these various kinds of data are used in the context of trajectory prediction system 170 is explained further below.

The remainder of this description is organized as follows. First, an overview is provided of the prediction phase (the on-line operational phase) of trajectory prediction system 170. Second, an overview is provided of the training phase of the system that precedes the prediction phase. Third, a particular embodiment is described in greater technical and mathematical detail. Fourth, a summary of the methods of the invention is provided.

Prediction module 220 generally includes instructions that when executed by the one or more processors 110 cause the one or more processors 110 to receive sensor data 270 from one or more sensors (e.g., in sensor system 120), the sensor data 270 including a location (e.g., spatial coordinates) of an object in an environment of the object. The environment of the object can, for example, include an area surrounding or in the vicinity of the object. As discussed above, sensor data 270 can include both raw sensor data (images, radar, LIDAR, etc.) and information derived from raw sensor data, such as the location (e.g., spatial coordinates) of the object. Prediction module 220 also generally includes instructions that when executed by the one or more processors 110 cause the one or more processors 110 to access a location-specific latent map 280 that was learned together with a neural-network-based trajectory predictor during a training phase of trajectory prediction system 170. The neural-network-based trajectory predictor associated with prediction module 220 and other modules of trajectory prediction system 170 can be deployed in a robot such as a vehicle 100 or a different type of robot, as discussed above.

Prediction module 220 also generally includes instructions that when executed by the one or more processors 110 cause the one or more processors 110 to input, to the neural-network-based trajectory predictor mentioned above, the location of the object and the location-specific latent map 280. The location-specific latent map 280 provides, to the neural-network-based trajectory predictor, a set of location-specific biases regarding the environment of the object. Those location-specific biases can pertain to both visual and non-visual features of the environment in which the object is located.

The kind of neural-network-based trajectory predictor used in conjunction with prediction module 220 can vary, depending on the specific embodiment. In one embodiment, a Social Generative Adversarial Network (S-GAN) is used. In another embodiment, a Social Long-Term-Memory Network (Social-LSTM) is used. In another embodiment, a Deep Stochastic Inverse Optimal Control (IOC) Recurrent Neural Network (RNN) Encoder-Decoder Framework (acronym "DESIRE") is used. In yet another embodiment, a variational neural network in conjunction with a Gaussian Mixture Model (GMM) is used. In yet another embodiment, a GAN framework is extended using a low-dimensional approximate semantic space, and that space is shaped to capture semantics such as merging and turning, in a vehicular application. An embodiment employing a S-GAN predictor is described in greater detail below.

Encoding module 250 generally includes instructions that when executed by the one or more processors 110 cause the one or more processors 110 to encode location (e.g., spatial-coordinates) data associated with an object before the location data is input to the neural-network-based trajectory predictor. In some embodiments, the location data associated with an object is encoded using a multi-layer perceptron (MLP). In some embodiments, encoding module 250 also includes instructions that when executed by the one or more processors 110 cause the one or more processors 110 to encode location-specific latent maps 280 using an encoder network such as a convolutional neural network (CNN). In other embodiments, the location-specific latent maps 280 are stored in database 260 without being encoded.

Output module 230 generally includes instructions that when executed by the one or more processors 110 cause the one or more processors 110 to output, from the neural-network-based trajectory predictor associated with prediction module 220, a predicted trajectory of the object. In some embodiments, in response to the predicted trajectory of the object, a downstream subsystem of the robot (e.g., of ego vehicle 100) controls, at least in part, one or more aspects of the operation of the robot (e.g., causes the robot to move in a particular way, such as to prevent the robot from colliding with the object). In a vehicular embodiment of trajectory prediction system 170, such aspects of operation could include steering, acceleration, deceleration, and/or braking. The downstream subsystem in vehicle 100 can control one or more aspects of the operation of a vehicle 100 via vehicle systems 140, autonomous driving module(s) 160, an ACC system, an ADAS system, or other shared- or parallel-autonomy control system of vehicle 100.

Training module 240 generally includes instructions that when executed by the one or more processors 110 cause the one or more processors 110 to train the neural-network-based trajectory predictor together with the learning of the location-specific latent maps 280 during a training phase of trajectory prediction system 170. As discussed above, training data 285 can include object position or trajectory data used to train a neural-network-based trajectory predictor and data used to learn the location-specific latent maps 280. In some embodiments, the location-specific latent maps 280 are learned using aerial (top-down) input images of the relevant locations. In other embodiments, other kinds of images (e.g., street-level images from vehicle and/or infrastructure cameras) can be used in learning the location-specific latent maps 280. In still other embodiments, other types of sensor data such as LIDAR data can be included in training data 285.

Training module 240 is not present in all embodiments of trajectory prediction system 170. In some embodiments, the training phase is performed in a location separate from the robot itself (e.g., in a company's research and development facility). The pertinent data and program code representing the trained neural-network-based trajectory predictor and the learned location-specific latent maps 280 can be downloaded to a robot (e.g., to an ego vehicle 100 via network 180, in some embodiments) for use in an on-line operational phase of trajectory prediction system 170. Thus, training data 285 is also not present in all embodiments of trajectory prediction system 170. In some embodiments, the training data 285 is instead stored separately from the robot at a facility where the training phase is carried out. Other components of trajectory prediction system 170 that are primarily relevant to the training phase are discussed below.

As mentioned above, in some embodiments, the robot in which trajectory prediction system 170 is deployed is an ego vehicle 100, and the object whose trajectory is predicted is a road agent (another vehicle, motorcycle, bicycle, scooter, pedestrian, etc.) external to the ego vehicle 100. In some of those embodiments, the ego vehicle 100 is an autonomous vehicle. Also, in some embodiments, the neural-network-based trajectory predictor associated with prediction module 220, in addition to predicting the trajectory of an object, can also infer information regarding roadway geometries (e.g., stop lines, lane boundaries, etc.) with the aid of the location-specific latent maps 280.

In other embodiments, an ego vehicle 100 is controlled, at least in part, by a human driver. In some of those embodiments, the robot and the object can be one and the same thing, and trajectory prediction system 170 can predict the trajectory of the ego vehicle 100 itself in support of, for example, an ACC system, an ADAS, or other shared- or parallel-autonomy system. In these embodiments, the neural-network-based trajectory predictor associated with prediction module 220, in addition to predicting the trajectory of an object, can also infer information regarding roadway geometries (e.g., stop lines, lane boundaries, etc.) with the aid of the location-specific latent maps 280, as in the other vehicle-based embodiments discussed in the preceding paragraph.

As discussed above, in some embodiments, a robot in which trajectory prediction system 170 is deployed is a different kind of robot other than a vehicle. In those embodiments, a robot can be deployed in, for example, a factory, warehouse, shopping mall, residence, or other setting. In some of those embodiments, the robot is deployed inside a building. In other embodiments, the robot is deployed in an outdoor setting. Also, in some embodiments, the robot is a humanoid robot. In general, the robot may be fixed in location, or it may be mobile. The robot may be fully autonomous, or it may be controlled, at least in part, by a human operator.

As discussed above, with proper training, trajectory prediction system 170 can predict object trajectories in locations for which no location-specific latent map 280 was learned during the training phase. That is, a location-specific latent map 280 can contribute to improved object trajectory prediction even in a location different from that corresponding to the location-specific latent map 280 itself.

A particular illustrative embodiment of trajectory prediction system 170 will next be described in greater technical and mathematical detail. In this embodiment, the objective is to predict a set of object trajectories $\hat{Y}=\{Y_1, \ldots, Y_N\}$ at a place $l \in \mathcal{P}$ (with $\mathcal{P}$ denoting the set of all considered places) from past temporally overlapping trajectories $X=\{X_1, \ldots, X_N\}$ and a learned location-specific latent map $M_l$, i.e., $\hat{Y}=f(X, M_l)$, such that $\hat{Y}$ approximates the ground-truth trajectories, Y, as closely as possible. The trajectories are represented as sequences $X_i=\{x_{i,t}\in \mathbb{R}^2 | t=1,\ldots,O\}$ and $Y_i=\{y_{i,t}\in \mathbb{R}^2 | t=1,\ldots,P\}$ with observation horizon O and prediction horizon P.

The neural network representing f is, in this embodiment, trained together with the location-specific latent maps $M_l$ (refer to Element 280 in FIG. 2). The location-specific latent maps 280 can be stored as tensors of size $H_l \times W_l \times F_{map}$, where $H_l$ and $W_l$ denote the reference image dimensions and $F_{map}$ denotes the map feature dimension. In this embodiment, the reference images are top-down (aerial) views of the environment to which a median filter has been applied, though, in other embodiments, the median filter can be omitted. Also, in other embodiments, other kinds of reference images can be used, such as street-level images from vehicle or infrastructure cameras.

In addition to trajectory losses during predictor training, weak supervisory information can be provided to obtain meaningful maps and ensure convergence. The maps can be trained to reconstruct the reference image and to encode information about environment semantics without providing full labels on the entire reference image. Also, this embodiment adds a gradient-based penalty term to support map smoothness.

In this embodiment, the learning of location-specific latent maps 280 is integrated with a S-GAN predictor. This is one example of the neural-network-based trajectory predictor discussed above. In this embodiment, the S-GAN generator network creates trajectory predictions through the use of a Long Short-Term Memory (LSTM) network. As those skilled in the art are aware, a LSTM network generally takes in a sequence of object coordinates (location information) and encodes them into a state vector. A separate predictor network generates a predicted trajectory (future location) 290 of the object based on the state vector. In this embodiment, the S-GAN network simultaneously processes the trajectories of all the objects in a given consecutive sequence of video frames and then "pools" the resulting state vectors of the separate LSTMs before making a prediction. The pooling mechanism serves to model social interactions. In more formal terms, for each trajectory $X_i$, the S-GAN LSTM cell follows the following recurrence:

$$e_c = MLP(x_{i,t}),$$

$$h_t = LSTM(h_{t-1}, e_c),$$

Where MLP denotes a multi-layer perceptron associated with encoding module 250 that encodes the coordinates of the object and $h_t$ is the hidden state of the LSTM at time t. This computation is carried out for each trajectory X individually. However, for simplicity of notation, the index of the trajectory is omitted, since it is clear from the context.

Since the predictor model is a GAN, it also includes, in this embodiment, a discriminator network that scores the trajectory produced by the generator network. In some embodiments, the discriminator network is used only during the training phase to improve the generator and is not part of the trajectory-prediction network during the on-line operational phase (i.e., at inference time). In other embodiments, the discriminator network is included at inference time to impose constraints on the predicted trajectories to ensure that they are reasonable.

Figure 3:
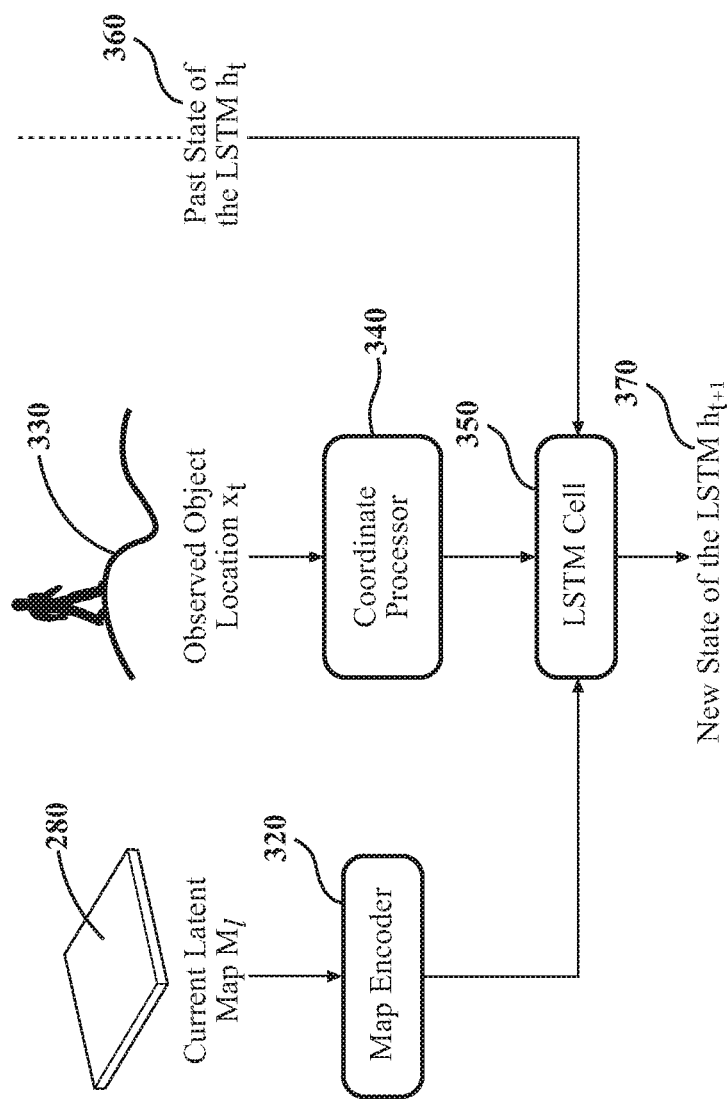
FIG. 3 is a block diagram of a portion of a trajectory prediction system, in accordance with an illustrative embodiment of the invention.

The location-specific latent maps 280 are integrated with the S-GAN model by providing an additional input to the first LSTM cell, as illustrated in FIG. 3. In FIG. 3, a current location-specific latent map $M_l$ 280 is encoded by a map encoder 320 (in this particular embodiment, a CNN) associated with encoding module 250, and the encoded map is input to the first LSTM cell 350 in the generator network. Also, the observed object location 330 $x_t$ (e.g., spatial coordinates) is encoded by coordinate processor 340 (in this particular embodiment, a MLP, as discussed above) associated with encoding module 250, and the encoded object location is input to the first LSTM cell 350. Based on these inputs and the past state of the LSTM $h_t$ 360, the first LSTM cell 350 outputs the new state of the LSTM $h_{t+1}$ 370. The additional input to the first LSTM cell for the location-specific latent map $M_l$ 280 changes the recurrence discussed above as follows:

$$e_m = CNN(C_{i,t}),$$

$$e_c = MLP(x_{i,t}),$$

$$h_t = LSTM(h_{t-1}, e_c, e_m),$$

where, in this embodiment, CNN corresponds to the map encoder 320 mentioned above, and $C_{i,t}$ is a patch of the location-specific latent map 280 around the location $x_{i,t}$. To predict the future location of the object, prediction module 220 passes the most recent LSTM state vector to a fully connected decoder network associated with output module 230, which outputs the predicted future position (290) of the object.

During the training phase, the generator network is trained using two loss terms, in this embodiment. In addition to the discriminator score $\mathcal{L}_{score}$, the S-GAN uses a L2 loss term between the predicted trajectory 290 and the ground-truth trajectory:

$$\mathcal{L}_{traj}(\hat{Y},Y) = \Sigma_{i=1}^N \Sigma_{t=1}^P \|\hat{y}_{i,t} - y_{i,t}\|^2.$$

In this embodiment, the location-specific latent maps 280 are stored as a set of trainable weights in map encoder 320. During the network's forward pass, any locations x in the considered scene can be used to extract a patch of size $H_{patch} \times W_{patch}$ denoted as $C = MapEncoder(M_l, x)$. Thus, $C_{i,t}$ above is obtained as $C_{i,t} = MapEncoder(M_l, x_{i,t})$.

To help the network better learn key features of the environment, this embodiment includes an image-explanation mechanism. This can be enforced by including a decoder network in prediction module 220 and providing an image-explanation loss to reconstruct the reference image according to $\mathcal{L}_{image}(l) = \|I_l - MapDecoder_R(M_l)\|$.

In this embodiment, a location-specific latent map 280 can decode semantic labels of a scene where the annotation is present. For example, in a vehicular embodiment, certain portions of a scene might be labeled "walkable" or "obstacle." In one embodiment, the former class is encoded as "+1," and the latter class is encoded as "−1." To support decoding of semantic labels, another module can be added to the system to decode the map into semantic class labels. The loss can be formulated as the difference between hand-annotated semantic labels and the decoded annotation: $\mathcal{L}_{labels}(l) = \Sigma_{t\in\mathcal{T}}(L_{l,i} - B_{l,i} \circ MapDecoder_s(M_l)_i)^2$, where $\mathcal{T}$ denotes the set representing label types, ∘ is the Hadamard product, and $B_{l,i}$ is a bitmask ensuring that no loss is incurred for areas that lack labels.

To ensure that the location-specific latent map 280 is as simple as possible, this embodiment includes a sparsity prior on the gradient of the latent map, $\mathcal{L}_{sparsity}(l) = \|\nabla M_l\|_1$. This can be implemented using a finite-differences approach computed by applying a convolution with the two predefined kernels $$\begin{bmatrix} 0 & 0 & 0 \\ \varepsilon & -\varepsilon & 0 \\ 0 & 0 & 0 \end{bmatrix} \text{ and } \begin{bmatrix} 0 & \varepsilon & 0 \\ 0 & -\varepsilon & 0 \\ 0 & 0 & 0 \end{bmatrix}$$

to the location-specific latent map 280. Then, prediction module 220 computes the norm by treating the resulting output as a vector.

Some additional details regarding the training phase will next be provided. For a given scene, training module 240 initializes the context map (280) and network with random weights selected from a Gaussian distribution. In this embodiment, training module 240 alternates training between the trajectory generator network and the discriminator network. The Generator Step and the Discriminator Step are described in turn below.

During the Generator Step, to train the generator network, training module 240 initially performs a forward pass by first selecting sections of the context map dependent on the scene and the object coordinates. Training module 240 inputs the coordinates and map sections into the network to predict the trajectories (290). Training module 240 computes several losses with respect to the context map and the resulting trajectories to train the network. Training module 240 trains the context map by taking a weighted average of the gradients computed in the three networks described above. The training objective, in this embodiment, is that the context map inform the trajectory prediction network to make more accurate predictions concisely and in a way that captures the key components of the reference image. The total loss for the generator network may be expressed as follows:

$$\mathcal{L}_G(\hat{Y},Y,l) = w_1 \cdot \mathcal{L}_{image}(l) + w_2 \cdot \mathcal{L}_{labels}(l) + w_3 \cdot \mathcal{L}_{sparsity}(l) + w_4 \cdot \mathcal{L}_{score}(\hat{Y}) + w_5 \cdot \mathcal{L}_{traj}(\hat{Y},Y).$$

During the Discriminator Step, training module 240 first passes a partial object trajectory to the trajectory generator network to get a predicted full trajectory. Training module 240 then passes the predicted trajectory and ground-truth trajectory to the discriminator network to obtain scores for the two trajectories. In this embodiment, the loss function of the discriminator is defined in the way known to those skilled in the art, but the discriminator's first LSTM cell is adapted in the same manner as in the generator network, as explained above. However, the discriminator, in this embodiment, does not have its own map decoder and is granted merely read-only access to the generator network's maps (i.e., the location-specific latent maps 280 are not changed during discriminator training). Permitting the discriminator to read the maps without modifying them promotes better convergence while, at the same time, not violating the GAN's theoretical equilibrium properties.

Figure 4:
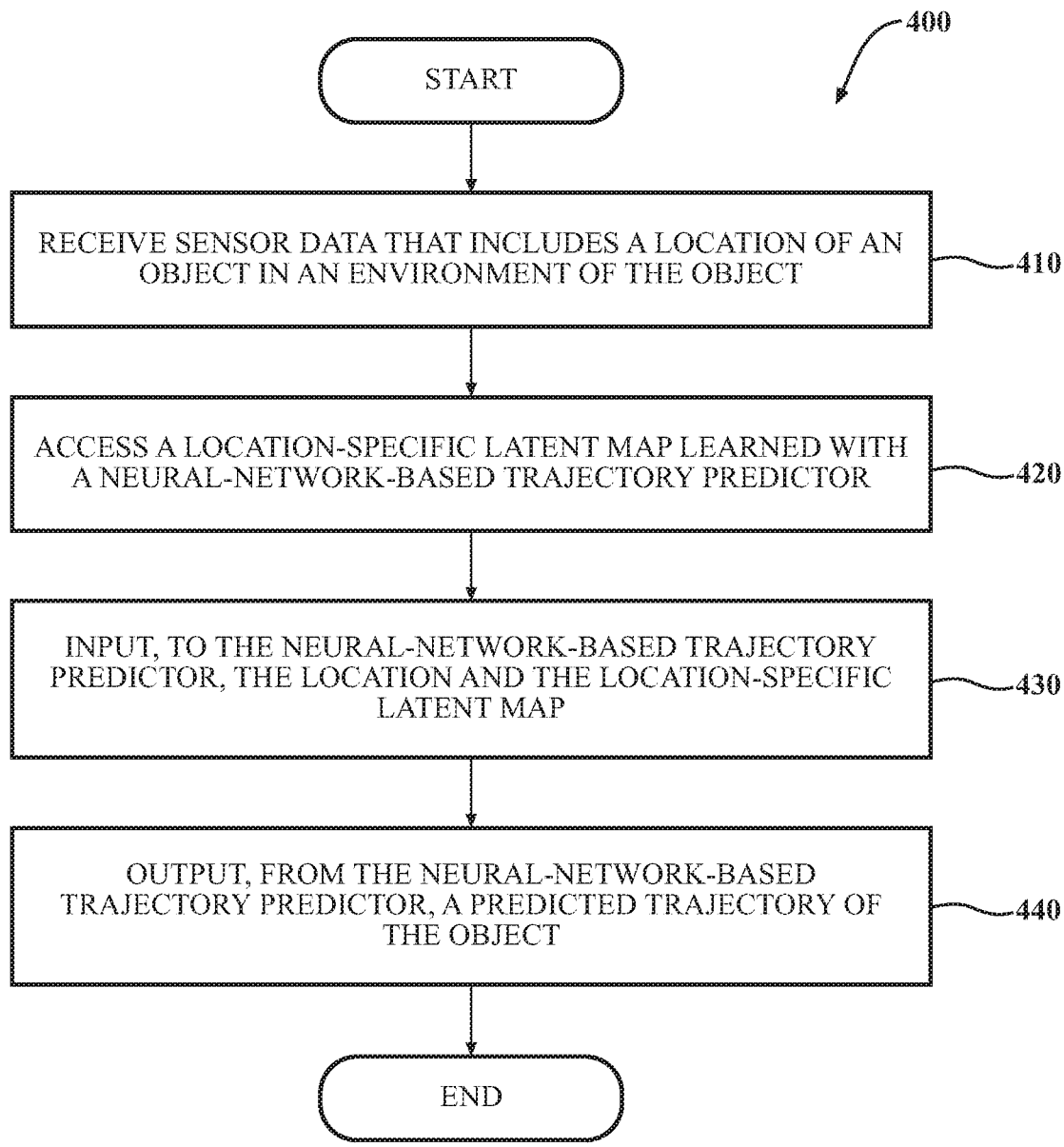
FIG. 4 is a flowchart of a method of predicting the trajectory of an object, in accordance with an illustrative embodiment of the invention.

FIG. 4 is a flowchart of a method 400 of predicting a trajectory of an object, in accordance with an illustrative embodiment of the invention. Method 400 will be discussed from the perspective of trajectory prediction system 170 in FIG. 2. While method 400 is discussed in combination with trajectory prediction system 170, it should be appreciated that method 400 is not limited to being implemented within trajectory prediction system 170, but trajectory prediction system 170 is instead one example of a system that may implement method 400. Note that some embodiments include additional actions that are not shown in FIG. 4. Those additional actions are discussed below after the discussion of FIG. 4.

At block 410, prediction module 220 receives sensor data 270 from one or more sensors that includes a location of an object in an environment of the object. As discussed above, sensor data 270 can include raw sensor data such as image data, radar data, LIDAR data, as well as information derived from the raw sensor data, such as object trajectories, poses, or position/location data (e.g., spatial coordinates). In some embodiments, additional sensor data can be received from one or more other network nodes 185 (e.g., cloud servers, infrastructure systems, etc.) via network 180.

At block 420, prediction module 220 accesses a location-specific latent map 280, the location-specific latent map 280 having been learned together with a neural-network-based trajectory predictor during a training phase. As discussed above, the neural-network-based trajectory predictor is, in some embodiments, deployed in a robot. As also discussed above, the kind of neural-network-based trajectory predictor used in conjunction with prediction module 220 can vary, depending on the specific embodiment. In one embodiment, an S-GAN is used. In another embodiment, a Social-LSTM is used. In another embodiment, a Deep Stochastic IOC RNN Encoder-Decoder Framework ("DESIRE") is used. In yet another embodiment, a variational neural network in conjunction with a GMM is used. In yet another embodiment, a GAN framework is extended using a low-dimensional approximate semantic space, and that space is shaped to capture semantics such as merging and turning, in a vehicular application.

At block 430, prediction module 220 inputs, to the neural-network-based trajectory predictor, the observed location of the object and the location-specific latent map 280. As explained above, the location-specific latent map 280 provides, to the neural-network-based trajectory predictor, a set of location-specific biases regarding the environment of the object. As also explained above, the location-specific biases can pertain to both visual and non-visual features of the environment in which the object is located.

At block 440, output module 230 outputs, from the neural-network-based trajectory predictor, a predicted trajectory 290 of the object.

In some embodiments, method 400 also includes encoding module 250 encoding the location-specific latent map 280 using an encoder network such as a CNN (refer to map encoder 320 in FIG. 3).

As discussed above, in some embodiments, the robot in which trajectory prediction system 170 is deployed is an ego vehicle 100, and the object whose trajectory is predicted is a road agent external to the ego vehicle 100. In some of those embodiments, the ego vehicle 100 is an autonomous vehicle. Also, in some embodiments, method 400 includes the neural-network-based trajectory predictor associated with prediction module 220, in addition to predicting the trajectory of an object, inferring information regarding roadway geometries with the aid of the location-specific latent maps 280.

In other embodiments, an ego vehicle 100 is controlled, at least in part, by a human driver. In some of those embodiments, the robot and the object can be one and the same thing, and method 400 can include trajectory prediction system 170 predicting the trajectory of the ego vehicle 100 itself in support of, for example, an ACC system, an ADAS, or other shared- or parallel-autonomy system. In these embodiments, method 400 includes the neural-network-based trajectory predictor associated with prediction module 220, in addition to predicting the trajectory of an object, inferring information regarding roadway geometries with the aid of the location-specific latent maps 280.

As discussed above, in some embodiments, a robot in which trajectory prediction system 170 is deployed is a different kind of robot other than a vehicle. In those embodiments, a robot can be deployed in, for example, a factory, warehouse, shopping mall, residence, or other setting. In some of those embodiments, method 400 includes the robot being deployed inside a building. In other embodiments, method 400 includes the robot being deployed in an outdoor setting. Also, in some embodiments, method 400 includes the robot being a humanoid robot. In general, the robot may be fixed in location, or it may be mobile. The robot may be fully autonomous, or it may be controlled, at least in part, by a human operator.

FIG. 1 will now be discussed in full detail as an example vehicle environment within which the systems and methods disclosed herein may be implemented. In some instances, the vehicle 100 can be configured to switch selectively between an autonomous mode, one or more semi-autonomous operational modes, and/or a manual mode. Such switching, also referred to as handover when transitioning to a manual mode, can be implemented in a suitable manner, now known or later developed. "Manual mode" means that all of or a majority of the navigation and/or maneuvering of the vehicle is performed according to inputs received from a user (e.g., human driver/operator).

In one or more implementations, the vehicle 100 can be an autonomous vehicle. As used herein, "autonomous vehicle" refers to a vehicle that operates in an autonomous mode. "Autonomous mode" refers to navigating and/or maneuvering a vehicle along a travel route using one or more computing devices to control the vehicle with minimal or no input from a human driver/operator. In one implementation, the vehicle 100 is configured with one or more semi-autonomous operational modes in which one or more computing devices perform a portion of the navigation and/or maneuvering of the vehicle along a travel route, and a vehicle operator (i.e., driver) provides inputs to the vehicle to perform a portion of the navigation and/or maneuvering of the vehicle 100 along a travel route. Thus, in one or more implementations, the vehicle 100 operates autonomously according to a particular defined level of autonomy.

The vehicle 100 can include one or more processors 110. In one or more arrangements, the one or more processors 110 can be a main processor of the vehicle 100. For instance, the one or more processors 110 can be an electronic control unit (ECU). The vehicle 100 can include one or more data stores 115 for storing one or more types of data. The data store(s) 115 can include volatile and/or non-volatile memory. Examples of suitable data stores 115 include RAM, flash memory, ROM, PROM (Programmable Read-Only Memory), EPROM, EEPROM (Electrically Erasable Programmable Read-Only Memory), registers, magnetic disks, optical disks, hard drives, or any other suitable storage medium, or any combination thereof. The data store(s) 115 can be a component(s) of the one or more processors 110, or the data store(s) 115 can be operatively connected to the one or more processors 110 for use thereby. The term "operatively connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. In one or more arrangement, the map data 116 can include one or more terrain maps 117. The terrain map(s) 117 can include information about the ground, terrain, roads, surfaces, and/or other features of one or more geographic areas. In one or more arrangement, the map data 116 can include one or more static obstacle maps 118. The static obstacle map(s) 118 can include information about one or more static obstacles located within one or more geographic areas.

The one or more data stores 115 can include sensor data 119. In this context, "sensor data" means any information about the sensors that a vehicle is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information on one or more LIDAR sensors 124 of the sensor system 120. As discussed above, in some embodiments, vehicle 100 can receive sensor data from other connected vehicles, from devices associated with ORUs, or both.

As noted above, the vehicle 100 can include the sensor system 120. The sensor system 120 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors can function independently from each other. Alternatively, two or more of the sensors can work in combination with each other. In such a case, the two or more sensors can form a sensor network. The sensor system 120 and/or the one or more sensors can be operatively connected to the one or more processors 110, the data store(s) 115, and/or another element of the vehicle 100 (including any of the elements shown in FIG. 1).

The sensor system 120 can include any suitable type of sensor. Various examples of different types of sensors will be described herein. However, it will be understood that the implementations are not limited to the particular sensors described. The sensor system 120 can include one or more vehicle sensors 121. The vehicle sensors 121 can detect, determine, and/or sense information about the vehicle 100 itself, including the operational status of various vehicle components and systems.

In one or more arrangements, the vehicle sensors 121 can be configured to detect, and/or sense position and/or orientation changes of the vehicle 100, such as, for example, based on inertial acceleration. In one or more arrangements, the vehicle sensors 121 can include one or more accelerometers, one or more gyroscopes, an inertial measurement unit (IMU), a dead-reckoning system, a global navigation satellite system (GNSS), a global positioning system (GPS), a navigation system 147, and/or other suitable sensors. The vehicle sensors 121 can be configured to detect, and/or sense one or more characteristics of the vehicle 100. In one or more arrangements, the vehicle sensors 121 can include a speedometer to determine a current speed of the vehicle 100.

Alternatively, or in addition, the sensor system 120 can include one or more environment sensors 122 configured to acquire, and/or sense driving environment data. "Driving environment data" includes any data or information about the external environment in which a vehicle is located or one or more portions thereof. For example, the one or more environment sensors 122 can be configured to detect, quantify, and/or sense obstacles in at least a portion of the external environment of the vehicle 100 and/or information/data about such obstacles. The one or more environment sensors 122 can be configured to detect, measure, quantify, and/or sense other things in at least a portion the external environment of the vehicle 100, such as, for example, nearby vehicles, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. Moreover, the sensor system 120 can include operator sensors that function to track or otherwise monitor aspects related to the driver/operator of the vehicle 100. However, it will be understood that the implementations are not limited to the particular sensors described. As an example, in one or more arrangements, the sensor system 120 can include one or more radar sensors 123, one or more LIDAR sensors 124, one or more sonar sensors 125, and/or one or more cameras 126.

The vehicle 100 can further include a communication system 130. The communication system 130 can include one or more components configured to facilitate communication between the vehicle 100 and one or more communication sources. Communication sources, as used herein, refers to people or devices with which the vehicle 100 can communicate with, such as external networks, computing devices, operator or occupants of the vehicle 100, or others. As part of the communication system 130, the vehicle 100 can include an input system 131. An "input system" includes any device, component, system, element or arrangement or groups thereof that enable information/data to be entered into a machine. In one or more examples, the input system 131 can receive an input from a vehicle occupant (e.g., a driver or a passenger). The vehicle 100 can include an output system 132. An "output system" includes any device, component, or arrangement or groups thereof that enable information/data to be presented to the one or more communication sources (e.g., a person, a vehicle passenger, etc.). The communication system 130 can further include specific elements which are part of or can interact with the input system 131 or the output system 132, such as one or more display device(s) 133, and one or more audio device(s) 134 (e.g., speakers and microphones).

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, each or any of the systems or portions thereof may be otherwise combined or segregated via hardware and/or software within the vehicle 100. The vehicle 100 can include a propulsion system 141, a braking system 142, a steering system 143, throttle system 144, a transmission system 145, a signaling system 146, and/or a navigation system 147. Each of these systems can include one or more devices, components, and/or combinations thereof, now known or later developed.

The one or more processors 110 and/or the autonomous driving module(s) 160 can be operatively connected to communicate with the various vehicle systems 140 and/or individual components thereof. For example, returning to FIG. 1, the one or more processors 110 and/or the autonomous driving module(s) 160 can be in communication to send and/or receive information from the various vehicle systems 140 to control the movement, speed, maneuvering, heading, direction, etc. of the vehicle 100. The one or more processors 110 and/or the autonomous driving module(s) 160 may control some or all of these vehicle systems 140 and, thus, may be partially or fully autonomous.

The vehicle 100 can include one or more modules, at least some of which are described herein. The modules can be implemented as computer-readable program code that, when executed by a processor 110, implement one or more of the various processes described herein. The processor 110 can be a device, such as a CPU, which is capable of receiving and executing one or more threads of instructions for the purpose of performing a task. One or more of the modules can be a component of the one or more processors 110, or one or more of the modules can be executed on and/or distributed among other processing systems to which the one or more processors 110 is operatively connected. The modules can include instructions (e.g., program logic) executable by one or more processors 110. Alternatively, or in addition, one or more data store 115 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

In some implementations, the vehicle 100 can include one or more autonomous driving modules 160. The autonomous driving module(s) 160 can be configured to receive data from the sensor system 120 and/or any other type of system capable of capturing information relating to the vehicle 100 and/or the external environment of the vehicle 100. In one or more arrangements, the autonomous driving module(s) 160 can use such data to generate one or more driving scene models. The autonomous driving module(s) 160 can determine the position and velocity of the vehicle 100. The autonomous driving module(s) 160 can determine the location of obstacles, or other environmental features including traffic signs, trees, shrubs, neighboring vehicles, pedestrians, etc.

The autonomous driving module(s) 160 can be configured to determine travel path(s), current autonomous driving maneuvers for the vehicle 100, future autonomous driving maneuvers and/or modifications to current autonomous driving maneuvers based on data acquired by the sensor system 120, driving scene models, and/or data from any other suitable source. "Driving maneuver" means one or more actions that affect the movement of a vehicle. Examples of driving maneuvers include: accelerating, decelerating, braking, turning, moving in a lateral direction of the vehicle 100, changing travel lanes, merging into a travel lane, and/or reversing, just to name a few possibilities. The autonomous driving module(s) 160 can be configured can be configured to implement determined driving maneuvers. The autonomous driving module(s) 160 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 160 can be configured to execute various vehicle functions and/or to transmit data to, receive data from, interact with, and/or control the vehicle 100 or one or more systems thereof (e.g., one or more of vehicle systems 140).

The noted functions and methods will become more apparent with a further discussion of the figures.

Detailed implementations are disclosed herein. However, it is to be understood that the disclosed implementations are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various implementations are shown in FIGS. 1-4, but the implementations are not limited to the illustrated structure or application.

The flowcharts and block diagrams in the figures illustrate the architecture, functionality, and operation of possible implementations of systems, methods, and computer program products according to various implementations. In this regard, each block in the flowcharts or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can be executed substantially concurrently, or the blocks can sometimes be executed in the reverse order, depending upon the functionality involved.

The systems, components and/or methods described above can be realized in hardware or a combination of hardware and software and can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with computer-usable program code that, when being loaded and executed, controls the processing system such that it carries out the methods described herein. The systems, components and/or methods also can be embedded in a computer-readable storage, such as a computer program product or other data programs storage device, readable by a machine, tangibly embodying a program of instructions executable by the machine to perform methods and methods described herein. These elements also can be embedded in an application product which comprises all the features enabling the implementation of the methods described herein and, which when loaded in a processing system, is able to carry out these methods.

Furthermore, arrangements described herein can take the form of a computer program product embodied in one or more computer-readable media having computer-readable program code embodied or embedded, such as stored thereon. Any combination of one or more computer-readable media can be utilized. The computer-readable medium can be a computer-readable signal medium or a computer-readable storage medium. The phrase "computer-readable storage medium" means a non-transitory storage medium. A computer-readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk drive (HDD), a solid state drive (SSD), a RAM, a ROM, an EPROM or Flash memory, an optical fiber, a portable compact disc read-only memory (CD-ROM), a digital versatile disc (DVD), an optical storage device, a magnetic storage device, or any suitable combination of the foregoing. In the context of this document, a computer-readable storage medium can be any tangible medium that can contain, or store a program for use by, or in connection with, an instruction execution system, apparatus, or device.

Program code embodied on a computer-readable medium can be transmitted using any appropriate medium, including but not limited to wireless, wireline, optical fiber, cable, RF, etc., or any suitable combination of the foregoing. Computer program code for carrying out operations for aspects of the present arrangements can be written in any combination of one or more programming languages, including an object-oriented programming language such as Java™, Smalltalk, C++ or the like and conventional procedural programming languages, such as the "C" programming language or similar programming languages. The program code can execute entirely on the user's computer, partly on the user's computer, as a stand-alone software package, partly on the user's computer and partly on a remote computer, or entirely on the remote computer or server. In the latter scenario, the remote computer can be connected to the user's computer through any type of network, including a LAN or a WAN, or the connection can be made to an external computer (for example, through the Internet using an Internet Service Provider).

In the description above, certain specific details are outlined in order to provide a thorough understanding of various implementations. However, one skilled in the art will understand that the invention may be practiced without these details. In other instances, well-known structures have not been shown or described in detail to avoid unnecessarily obscuring descriptions of the implementations. Unless the context requires otherwise, throughout the specification and claims which follow, the word "comprise" and variations thereof, such as, "comprises" and "comprising" are to be construed in an open, inclusive sense, that is, as "including, but not limited to." Further, headings provided herein are for convenience only and do not interpret the scope or meaning of the claimed invention.

Reference throughout this specification to "one or more implementations" or "an implementation" means that a particular feature, structure or characteristic described in connection with the implementation is included in at least one or more implementations. Thus, the appearances of the phrases "in one or more implementations" or "in an implementation" in various places throughout this specification are not necessarily all referring to the same implementation. Furthermore, the particular features, structures, or characteristics may be combined in any suitable manner in one or more implementations. Also, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings (such as "Background" and "Summary") and sub-headings used herein are intended only for general organization of topics within the present disclosure and are not intended to limit the disclosure of the technology or any aspect thereof. The recitation of multiple implementations having stated features is not intended to exclude other implementations having additional features, or other implementations incorporating different combinations of the stated features. As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an implementation can or may comprise certain elements or features does not exclude other implementations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an implementation or particular system is included in at least one or more implementations or aspect. The appearances of the phrase "in one aspect" (or variations thereof) are not necessarily referring to the same aspect or implementation. It should also be understood that the various method steps discussed herein do not have to be carried out in the same order as depicted, and not each method step is required in each aspect or implementation.

Generally, "module," as used herein, includes routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an application-specific integrated circuit (ASIC), a hardware component of a system on a chip (SoC), as a programmable logic array (PLA), or as another suitable hardware component that is embedded with a defined configuration set (e.g., instructions) for performing the disclosed functions.

The terms "a" and "an," as used herein, are defined as one as or more than one. The term "plurality," as used herein, is defined as two or more than two. The term "another," as used herein, is defined as at least a second or more. The terms "including" and/or "having," as used herein, are defined as including (i.e., open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g., AB, AC, BC or ABC).

The preceding description of the implementations has been provided for purposes of illustration and description. It is not intended to be exhaustive or to limit the disclosure. Individual elements or features of a particular implementation are generally not limited to that particular implementation, but, where applicable, are interchangeable and can be used in a selected implementation, even if not specifically shown or described. The same may also be varied in many ways. Such variations should not be regarded as a departure from the disclosure, and all such modifications are intended to be included within the scope of the disclosure.

While the preceding is directed to implementations of the disclosed devices, systems, and methods, other and further implementations of the disclosed devices, systems, and methods can be devised without departing from the basic scope thereof. The scope thereof is determined by the claims that follow.

What is claimed is:

1. A system for predicting a trajectory of an object, the system comprising:
   one or more sensors;
   one or more processors; and
   a memory communicably coupled to the one or more processors and storing:
   a prediction module including instructions that when executed by the one or more processors cause the one or more processors to:
      receive sensor data from the one or more sensors that includes a location of the object in an environment of the object;
      access a location-specific latent map, the location-specific latent map having been learned together with a neural-network-based trajectory predictor during a training phase, wherein the neural-network-based trajectory predictor is deployed in a robot; and
      input, to the neural-network-based trajectory predictor, the location of the object and the location-specific latent map, the location-specific latent map providing, to the neural-network-based trajectory predictor, a set of location-specific biases regarding the environment of the object; and
   an output module including instructions that when executed by the one or more processors cause the one or more processors to output, from the neural-network-based trajectory predictor, a predicted trajectory of the object.

2. The system of claim 1, wherein the robot is an ego vehicle and the object is a road agent external to the ego vehicle.

3. The system of claim 2, wherein the ego vehicle is an autonomous vehicle.

4. The system of claim 2, wherein the predicted trajectory of the object includes information regarding roadway geometries inferred by the neural-network-based trajectory predictor.

5. The system of claim 1, wherein the robot and the object are one and the same thing and the robot is an ego vehicle that is at least partially controlled by a human driver.

6. The system of claim 5, wherein the predicted trajectory of the object includes information regarding roadway geometries inferred by the neural-network-based trajectory predictor.

7. The system of claim 1, wherein the set of location-specific biases regarding the environment of the object pertains to both visual and non-visual features of the environment of the object.

8. The system of claim 1, further comprising an encoding module including instructions that when executed by the one or more processors cause the one or more processors to encode the location-specific latent map using a convolutional neural network (CNN).

9. The system of claim 1, wherein the location-specific latent map corresponds to at least a portion of the environment of the object.

10. The system of claim 1, wherein the neural-network-based trajectory predictor includes one of a social generative adversarial network (S-GAN) and a social long short-term memory (Social-LSTM) network.

11. A non-transitory computer-readable medium for predicting a trajectory of an object and storing instructions that when executed by one or more processors cause the one or more processors to:
- receive sensor data that includes a location of the object in an environment of the object;
- access a location-specific latent map, the location-specific latent map having been learned together with a neural-network-based trajectory predictor during a training phase, wherein the neural-network-based trajectory predictor is deployed in a robot;
- input, to the neural-network-based trajectory predictor, the location of the object and the location-specific latent map, the location-specific latent map providing, to the neural-network-based trajectory predictor, a set of location-specific biases regarding the environment of the object; and
- output, from the neural-network-based trajectory predictor, a predicted trajectory of the object.

12. The non-transitory computer-readable medium of claim 11, wherein the set of location-specific biases regarding the environment of the object pertains to both visual and non-visual features of the environment of the object.

13. A method of predicting a trajectory of an object, the method comprising:
- receiving sensor data that includes a location of the object in an environment of the object;
- accessing a location-specific latent map, the location-specific latent map having been learned together with a neural-network-based trajectory predictor during a training phase, wherein the neural-network-based trajectory predictor is deployed in a robot;
- inputting, to the neural-network-based trajectory predictor, the location of the object and the location-specific latent map, the location-specific latent map providing, to the neural-network-based trajectory predictor, a set of location-specific biases regarding the environment of the object; and
- outputting, from the neural-network-based trajectory predictor, a predicted trajectory of the object.

14. The method of claim 13, wherein the robot is an ego vehicle and the object is a road agent external to the ego vehicle.

15. The method of claim 14, wherein the ego vehicle is an autonomous vehicle.

16. The method of claim 14, wherein the predicted trajectory of the object includes information regarding roadway geometries inferred by the neural-network-based trajectory predictor.

17. The method of claim 13, wherein the robot and the object are one and the same thing and the robot is an ego vehicle that is at least partially controlled by a human driver.

18. The method of claim 17, wherein the predicted trajectory of the object includes information regarding roadway geometries inferred by the neural-network-based trajectory predictor.

19. The method of claim 13, wherein the robot is deployed inside a building.

20. The method of claim 13, further comprising encoding the location-specific latent map using a convolutional neural network.

* * * * *